(12) United States Patent
Ogawa et al.

(10) Patent No.: US 7,387,967 B2
(45) Date of Patent: Jun. 17, 2008

(54) COLUMNAR STRUCTURED MATERIAL AND METHOD OF MANUFACTURING THE SAME

(75) Inventors: Miki Ogawa, Ayase (JP); Hirokatsu Miyata, Hadano (JP); Albrecht Otto, Atsugi (JP); Akira Kuriyama, Atsugi (JP); Hiroshi Okura, Hadano (JP); Tohru Den, Tokyo (JP); Kazuhiko Fukutani, Santa Cruz, CA (US)

(73) Assignee: Canon Kabushiki Kaisha, Tokyo (JP)

( * ) Notice: Subject to any disclaimer, the term of this patent is extended or adjusted under 35 U.S.C. 154(b) by 345 days.

(21) Appl. No.: 10/535,452

(22) PCT Filed: Dec. 12, 2003

(86) PCT No.: PCT/JP03/15950

§ 371 (c)(1),
(2), (4) Date: May 19, 2005

(87) PCT Pub. No.: WO2004/055872

PCT Pub. Date: Jul. 1, 2004

(65) Prior Publication Data

US 2006/0012013 A1 Jan. 19, 2006

(30) Foreign Application Priority Data

Dec. 13, 2002 (JP) ............................. 2002-363132

(51) Int. Cl.
*H01L 21/461* (2006.01)
*H01L 21/302* (2006.01)

(52) U.S. Cl. ..................... 438/706; 438/717; 438/718

(58) Field of Classification Search ..................... None
See application file for complete search history.

(56) References Cited

U.S. PATENT DOCUMENTS

| 3,674,658 | A | * | 7/1972 | van Asperen et al. | ........ 205/50 |
| 4,420,365 | A | * | 12/1983 | Lehrer | ........................ 438/702 |
| 5,068,152 | A | * | 11/1991 | Maro et al. | .................. 428/408 |
| 5,131,954 | A | * | 7/1992 | Vogeli et al. | ................ 136/244 |

(Continued)

FOREIGN PATENT DOCUMENTS

EP 0 851 506 7/1998

(Continued)

OTHER PUBLICATIONS

Wolf et al., Silicon Processing for the VLSI Era, vol. 1, 1986, pp. 407-408.*

(Continued)

*Primary Examiner*—Duy-Vu N Deo
(74) *Attorney, Agent, or Firm*—Fitzpatrick, Cella, Harper & Scinto

(57) ABSTRACT

A method of manufacturing a dot pattern includes the steps of preparing a structured material composed of a plurality of columnar members containing a first component and a region containing a second component different from the first component surrounding the columnar members, with the structured material being formed by depositing the first component and the second component on a substrate, and removing the columnar members from the structured material to form a porous material having a columnar hole. Additional steps include introducing a mask material into the columnar hole of the porous material to form a dot pattern, and removing the porous material.

13 Claims, 5 Drawing Sheets

U.S. PATENT DOCUMENTS

| | | | |
|---|---|---|---|
| 5,240,558 A | 8/1993 | Kawasaki et al. | 156/659.1 |
| 5,244,828 A | 9/1993 | Okada et al. | 437/81 |
| 5,369,873 A | 12/1994 | Walters et al. | 29/599 |
| 6,027,796 A | 2/2000 | Kondoh et al. | 428/312.8 |
| 6,602,620 B1 | 8/2003 | Kikitsu et al. | 428/694 T |
| 6,730,421 B1 * | 5/2004 | Kirino et al. | 428/831.2 |
| 7,282,268 B2 | 10/2007 | Fukutani et al. | 428/446 |
| 2001/0042502 A1 | 11/2001 | Shih et al. | 117/3 |
| 2002/0167013 A1 | 11/2002 | Iwasaki et al. | 257/79 |
| 2003/0175472 A1 | 9/2003 | Den et al. | 428/66.6 |
| 2004/0033339 A1 | 2/2004 | Fukutani et al. | 428/137 |
| 2004/0043208 A1 | 3/2004 | Fukutani et al. | 428/304.4 |
| 2004/0048092 A1 | 3/2004 | Yasui et al. | 428/642 |
| 2004/0166376 A1 * | 8/2004 | Kirino et al. | 428/694 TM |

FOREIGN PATENT DOCUMENTS

| | | |
|---|---|---|
| JP | 58-142523 | 8/1983 |
| JP | 2-139714 | 5/1990 |
| JP | 5-55545 | 3/1993 |
| JP | 7-202164 | 8/1995 |
| JP | 9-157062 | 6/1997 |
| JP | 11-31862 | 2/1999 |
| JP | 11-112099 | 4/1999 |
| JP | 11-251334 | 9/1999 |
| JP | 2000-327491 | 11/2000 |
| JP | 2001-261376 | 9/2001 |
| WO | WO 01/71394 | 9/2001 |
| WO | WO 03/069677 | 8/2003 |

OTHER PUBLICATIONS

M. Haupt, et al., "Semiconductor Nanostructures Defined with Self-Organizing Polymers", Journal of Applied Physics, vol. 91, No. 9, pp. 6057-6059 (May 1, 2002).

M. Jacobs, et al., "Unbalanced Magnetron Sputtered Si-Al Coatings: Plasma Conditions and Film Properties Versus Sample Bias Voltage", Surface and Coatings Technology, 116-119, pp. 735-741 (1999).

C.D. Adams, et al., "Transition from Lateral to Transverse Phase Separation During Film Co-Deposition", Appl. Phys. Lett., 59 (20), pp. 2535-2537 (Nov. 11, 1991).

M. Atzmon, et al., "Phase Separation During Film Growth", J. Appl. Phys. 72 (2), pp. 442-446 (Jul. 15, 1992).

C.D. Adams, et al., "Monte Carlo Simulation of Phase Separation During Thin-Film Codeposition", J. Appl. Phys., 74 (3), pp. 1707-1715 (Aug. 1, 1993).

C.D. Adams, et al., "Phase Separation During Co-Deposition of Al-Ge Thin Films", Journal of Materials Research, vol. 7, No. 3, p. 653 (Mar. 1992).

N. E. Sluchanko, et al., "Late Stages of Phase Separation in $Al_{1-x}Si_x$ Solid Solutions", Physical Review B, vol. 53, No. 17, pp. 11 304-11 306 (May 1, 1996).

* cited by examiner

COLUMNAR STRUCTURED MATERIAL AND METHOD OF MANUFACTURING THE SAME

TECHNICAL FIELD

The present invention relates to a columnar structured material having a microstructure and a method of manufacturing the same. More particularly, the invention relates to a columnar structured material manufacturing method with which columnar portions of a columnar structured material each having an extremely minute diameter and having a uniform size can be formed and arranged on a substrate at extremely narrow intervals. In particular, the invention contributes to achieving enhanced functions and performances of electronic devices and optical devices both utilizing a quantum effect.

BACKGROUND ART

A so-called "low dimensional quantum structure", in which a microstructure of a semiconductor having a narrow band gap is surrounded in a two-dimensional or three-dimensional manner by a semiconductor having a wide band gap, is regarded as promising for achieving enhanced functions and performances of optical devices and electronic devices, and recently has been attracting an increasing interest as a key for the future development of the optical and electronic industries. In particular, since a quantum dot as a three-dimensional quantum enclosing structure exhibits a remarkable quantum effect in a wide variety of applications due to the sharpness of a state density based on the strong electron-enclosing effect, realization of the quantum dot is anticipated as a basic structure of the optical and electronic devices having functions and performances superior to those of the prior art.

As for a technique for forming these microstructures, there is a lithography technique utilizing an electron beam, an ion beam, or an STM needle. In recent years, a fine patterning up to 100 nm or less has become possible. However, these methods have such a disadvantage that a manufacturing cost is still high, and it takes a lot of time to carry out the processing. In addition, in order to further increase the enclosing effect, a structure having a size on the order of even smaller than 100 nm is required.

In order to solve the above-mentioned problems, there has been proposed a method in which a substrate is selectively etched using a mask having a microstructure to form a microstructured material. Since a large number of microstructured materials can be formed at a time by the method using a mask, this method is very advantageous in terms of processing time.

In JP 11-112099 A, there is disclosed a method in which first of all, a mask material is deposited on a substrate with a porous material called a trough hole membrance having a plurality of through holes as a mask, a pattern of dots made of the mask material is formed, and the substrate is selectively etched with the dot pattern as a mask to form minute projections on a surface of the substrate.

In addition, in Journal of Applied Physics, Vol. 91, No. 9, 6057 (2002), there is reported a method in which a cluster of gold is formed on a surface of a substrate by utilizing nucleus portions of micelle formed from a diblock copolymer, and a pillar-like structured material is manufactured with the cluster as a mask. In this case, it is described that a size of the mask, i.e., the cluster can be regulated by an amount of metallic salt dissolved in a diblock polymer solution, and intervals of arrangement can be regulated by a molecular weight of a hydrophobic portion of the diblock polymer.

In these methods using a mask, it can be said that a size of a microstructured material finally formed, and intervals of arrangement are substantially determined by a structure of the mask.

In JP 11-112099 A as well, a structure of the minute projections is determined by a structure of the through hole membrane serving as the first mask. The through hole membrane described in above-mentioned JP 11-112099 A is formed such that another substrate having projections arranged at desired intervals is pressed against an aluminium substrate to form a minute depression pattern on the aluminium substrate, and next, the aluminium substrate is subjected to anodic oxidation in an acid electrolytic solution to thereby form holes from the minute depression portions. Accordingly, arrangement intervals of the minute depressions can not be made equal to or smaller than the original arrangement intervals of the projections on the other substrate, and hence it is conceivable that the practical limit of the arrangement intervals is of the order of several nano-meters. In addition, although a hole diameter can be increased within a range not exceeding the arrangement intervals through an after-treatment, it is difficult to make the hole diameter smaller. Hence, the hole diameter is substantially of the order of several tens nano-meters in many cases.

However, it is said that if a size of a microstructure of a semiconductor is made about equal to or smaller than 20 nm, then a distribution of energies of the electrons or holes within the structure can be made very narrow. For example, if a microstructure called a quantum fine line or a quantum dot is applied to a semiconductor laser, then it is possible to realize a semiconductor laser having an extremely low threshold current. Accordingly, in order to realize such a semiconductor laser, there is required a technique for uniformly and densely forming a structure having a shape of a size of the order of even smaller than several tens nano-meters mentioned above.

In addition, application of such a microstructured material to a single electron device such as a single electron transistor or a single electron memory is also anticipated. However, in many cases, such a microstructured material exhibits its unique property such as a quantum size effect only when its size becomes smaller than 10 nm. Accordingly, from the viewpoint of application to the single electron device as well, the realization of an ultra-micro structure is desired.

On the other hand, according to the report of Journal of Applied Physics, Vol. 91, No. 9, 6057 (2002), a piller-like structured material having a diameter equal to or smaller than 10 nm becomes possible. However, the arrangement intervals are regulated by a size of the micelle formed from the diblock polymer, and hence are about 100 nm. For stable formation of the micelle, it is necessary to stably separate a hydrophobic portion and a hydrophilic portion of the diblock polymer. In order to attain this, a certain chain length is required for the hydrophobic portion and the hydrophilic portion within the polymer. Accordingly, there is actually a limit to shortening of the arrangement intervals by shortening of a chain length of the hydrophobic portion. Hence, it can be said that problems remain in achieving higher density as mentioned above.

The present invention has been made in the light of the above-mentioned problems, and it is therefore an object of the present invention to provide a method of forming, on a substrate, columnar portions of a columnar structured material each having an extremely minute size at minute intervals at a low cost and in a short period of time, and a columnar structured material formed by utilizing the manufacturing method.

DISCLOSURE OF INVENTION

A method of manufacturing a mask member according to the present invention is characterized by including the steps of: preparing a structured material including a plurality of columnar members, and a region surrounding the columnar members; removing the columnar members from the structured material to form a porous material having columnar hole portions; and introducing a mask material into the columnar hole portions of the porous material.

Further, a mask member according to the present invention is characterized in that the mask member is obtained by introducing a mask material into a porous material obtained by removing columnar members from a structured material formed so as to include the columnar members and a region surrounding the columnar members.

In this structure, it is preferable that columnar members formed so as to contain a first material are surrounded by the region formed so as to contain a second material, and that the second material is contained at a ratio of not less than 20 atomic % and not more than 70 atomic % with respect to the total amount of the first material and the second material.

In order to achieve the above-mentioned object, according to the present invention, there is provided a columnar structured material formed on a substrate so as to have a columnar structure, characterized in that the columnar structure is formed through an etching process in which dots are utilized as a mask on a substrate, the dots being made of a mask material and obtained by removing a porous material after the mask material is introduced into holes of the porous material having columnar holes formed by removing columnar substances from a structured material in which the columnar substances formed so as to contain a first component are dispersed in a member formed so as to contain a second component that can form a eutectic together with the first component.

It is preferable that the structured material is formed of a thin film.

It is preferable that the columnar substance is made of aluminium and the member is made of silicon, and wherein the ratio of silicon in the structured material is in a range of not less than 20 atomic % and not more than 70 atomic %. Alternatively, it is preferable that the columnar substance is made of aluminium and the member is made of germanium, and wherein the ratio of germanium in the structured material is in a range of not less than 20 atomic % and more than 70 atomic %.

It is preferable that a main component of the porous material is silicon or germanium.

It is preferable that the diameter of the columnar structured material is not smaller than 0.5 nm and not larger than 15 nm. It is preferable that the interval between adjacent columnar portions of the columnar structured material is not less than 5 nm and not larger than 20 nm.

It is preferable that the columnar substance is a crystalline substance, and the member is an amorphous substance.

It is preferable that the mask material forming the dots contains a noble metal, especially gold.

It is preferable that the columnar structured material is made of one layer or a plurality of layers of materials and that at least one of the one layer or the plurality of layers of materials is a semiconductor.

Further, a method of manufacturing a columnar structured material according to the present invention is characterized by including: a step of preparing, on a substrate, a structured material in which columnar substances formed so as to contain a first component are dispersed in a member formed so as to contain a second component that can form a eutectic together with the first component; a removal step of removing the columnar substances; an introducing step of introducing a mask material into columnar holes of a porous material having the columnar holes obtained through the removal step; a step of preparing dots made of the mask material by removing the member; a step of etching the substrate with the dots as a mask; and a step of removing the dots. It is preferable that the removal step of removing the columnar substances is an etching step.

It is preferable that the introducing step of introducing a mask material into the holes is an electrodeposition step.

It is preferable that the step of etching the substrate with the dots as a mask is a dry etching step.

A structured material serving as a base material of the above-mentioned porous material will hereinbelow be described.

The structured material to which the present invention is applied is a structured material formed so as to contain the first component and the second component, and the columnar substances formed so as to contain the first component are surrounded by a member formed so as to contain the second component. In this structure, it is desirable that the second component be contained in the structured material at a ratio of not less than 20 atomic % and not more than 70 atomic % with respect to the total amount of the first component and the second component.

The above-mentioned ratio means a ratio of an amount of the second component to the total amount of first component and second component which constitute the above-mentioned structured material, and is preferably not less than 25 atomic % and not more than 65 atomic %, and is more preferably not less than 30 atomic % and not more than 60 atomic %.

Note that, for the above-mentioned columnar substance, it suffices that a columnar shape is substantially realized. For example, the second component may be contained as a component of the columnar substance, or the first component may be contained as a component of the above-mentioned member. In addition, a small amount of element such as oxygen, argon, nitrogen, or hydrogen may be contained in the columnar substance or in a member in the periphery of the columnar substance.

The above-mentioned ratio is obtained by carrying out a quantitative analysis utilizing an induction-coupled plasma emission spectrometry method for example.

As for the above-mentioned first and second components, materials having a eutectic point in a component system phase equilibrium diagram of both the materials (so-called eutectic system materials) are preferable. In particular, materials having a eutectic point equal to or higher than 300° C., preferably equal to or higher than 400° C. are desirable. Note that, as for a preferred combination of the first component and the second component, one in which Al is used as the first component and Si is used as the second component, one in which Al is used as the first component and Ge is used as the second component, or one in which Al is used as the first component and $Si_xGe_{1-x}$ (0<x<1) is used as the second component is preferable.

A planar shape of each column of the above-mentioned columnar substance is a circular or elliptical shape. In the above-mentioned structured material, a plurality of the columnar substances are arranged in a matrix formed so as to contain the second component. A size of each columnar substance (a diameter when the planar shape is a circle) can be controlled mainly in accordance with the composition of the above-mentioned structured material (i.e., a ratio of the second component). Its average diameter is not smaller than 0.5 nm and not larger than 50 nm, preferably not smaller 0.5 nm and not larger than 20 nm, and more preferably not smaller than 0.5 nm and not larger than 15 nm. In the case of an ellipse, it suffices that a length of the largest outer diameter portion falls within the above-mentioned range. Here, the average diameter means a value which is directly derived from a photograph of columnar portions observed from an actual SEM picture (in a range of about 100 nm×about 70 nm), or indirectly derived by image-processing the SEM picture with a computer. A practical lower limit of the average diameter is not smaller than 1 nm and not larger than several nano-meters.

In addition, a center-to-center distance 2R between the plurality of columnar substances is not smaller than 2 nm and not larger than 30 nm, preferably not smaller than 5 nm and not larger than 20 nm, and more preferably not smaller than 5 nm and not larger than 15 nm. Of course, the above-mentioned distance 2R as a lower limit of the center-to-center distance has to have at least such an interval that does not cause the columnar substances to come into contact with each other.

The above-mentioned structured material is preferably a film-like structured material. In such a case, the above-mentioned columnar substances are dispersed in a matrix formed so as to contain the second component in such a manner as to be substantially perpendicular to an intra-face direction of the film. While a thickness of the film-like structured material is not particularly limited, a range of 1 nm to 100 μm may be applied. Considering a process time and the like, a more realistic film thickness falls within a range of about 1 nm to about 1 μm. In particular, it is preferable that the columnar structure be maintained even with a thickness equal to or larger than 300 nm.

The above-mentioned structured material is preferably a film-like structured material. In this case, the structured material may be provided on a substrate. While the substrate used is not particularly limited, an insulating substrate such as a quartz glass substrate, a semiconductor substrate such as a silicon substrate, a gallium arsenide substrate or an indium phosphorus substrate, or a metallic substrate such as an aluminium substrate, or, as long as the above-mentioned structured material can be formed on the substrate as a supporting member, a flexible substrate (e.g., a polyimide resin substrate) can be used.

The above-mentioned structured material can be formed by utilizing a method of forming a film in a non-equilibrium state. As for the film forming method concerned, a sputtering method is preferable. However, there can be adopted an arbitrary film forming method in which a substance is formed in a non-equilibrium state by various methods such as a resistance heating vacuum evaporation method, an electron beam vacuum evaporation (EB vacuum evaporation) method, or an ion plating method. In a case where the sputtering method is adopted for formation of the structured material, a magnetron sputtering method, an RF sputtering method, an ECR sputtering method, or a DC sputtering method can be used. Also, in the case where the sputtering method is used, a film is formed while setting a pressure within a reactor to be within a range of about 0.2 to about 1 Pa in an atmosphere of argon gas. When performing the sputtering, while the first material and the second material which were separately prepared may be used as a raw material of a target, alternatively, a target material in which the first material and the second material are previously baked at a desired ratio may also be used.

The above-mentioned structured material to be formed on a substrate is formed at a substrate temperature of not lower than 20° C. and not higher than 300° C., preferably not lower than 20° C. and not higher than 300° C.

The above-mentioned columnar substance is removed from the above-mentioned structured material (by wet etching or dry etching) to thereby form a porous material having a plurality of columnar holes. When performing the etching, it suffices that the columnar member can be selectively removed. As for an etchant, an acid such as phosphoric acid, sulfuric acid, hydrochloric acid, or nitric acid is suitable. It is suitable that holes of a porous material formed through the removal process are not linked to one another, but are independent of one another.

A method of forming a porous material from the above-mentioned structured material desirably includes the steps of: preparing a structured material formed so as to contain a first component and a second component, with a columnar member formed so as to contain the first component being surrounded by a region formed so as to contain the second component, the second component being contained in the structured material at a ratio of not less than 20 atomic % and not more than 70 atomic % with respect to the total amount of first component and second component; and removing the columnar member from the structured material.

BEST MODE FOR CARRYING OUT THE INVENTION

An embodiment of a columnar structured material according to the present invention and a method of manufacturing the same will hereinafter be described with reference to the accompanying drawings.

In this embodiment, a pattern of minute dots is formed using a novel porous film having an extremely minute hole diameter and extremely minute intervals of arrangement of microholes as compared with a conventional porous material, and a columnar structured material having an extremely minute structure is manufactured with the dot pattern used as a mask.

Here, a description will now be given of the porous film according to this embodiment.

Figure 2:
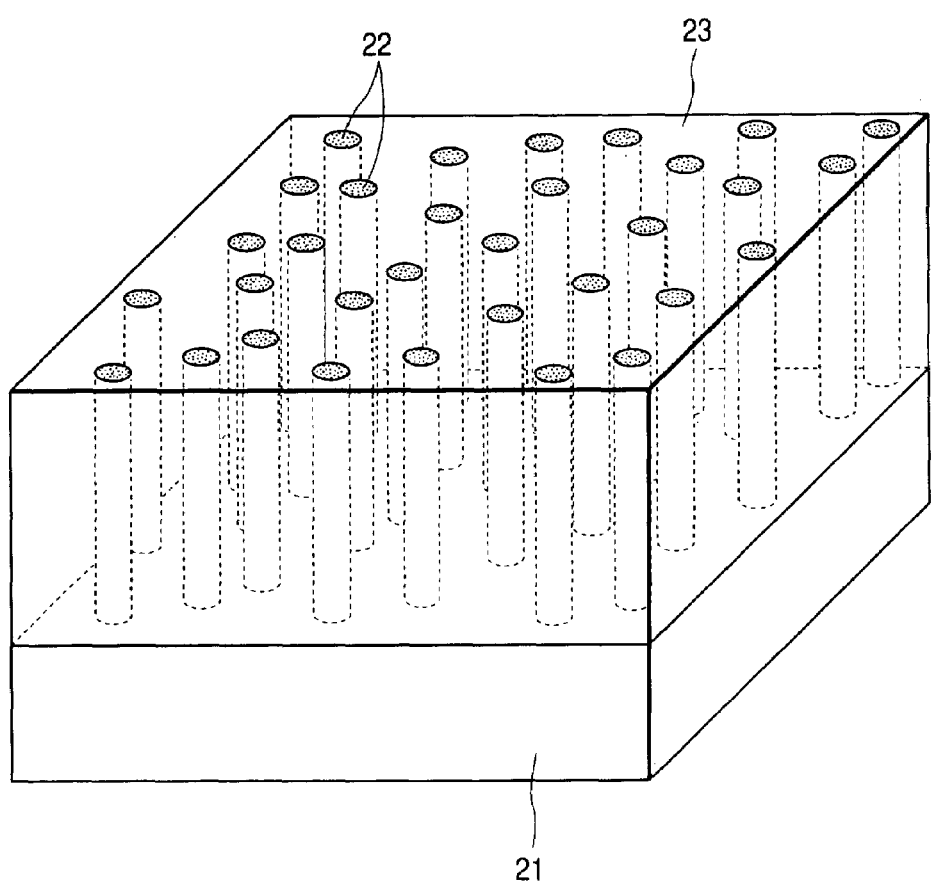
FIG. 2 is a schematic view showing a structure of a film in which a columnar substance according to the embodiment of the present invention is formed.

When a film made of a plurality of substances forming a eutectic system together is formed on a substrate by utilizing a sputtering method or the like for example, components of these substances are present independently of one another in the film without being mixed with one another. Then, in a case where film forming conditions and composition of substances are optimized with respect to a specific material system, as shown in FIG. 2, a structure is formed in which a certain component is dispersed to be present in a matrix 23 of other component in the form of a column having a minute diameter, i.e., a columnar substance 22. This structure is a novel structure discovered by the present inventors. The columnar substances are present so as to completely extend from an interface of a substrate 21 to a surface of a film. A diameter of one column of the formed columnar substance is in a range of 0.5 to 15 nm. In addition, a center-to-center interval of the columnar substance is in a range of 5 to 20 nm.

Giving a description using a specific example, when a mixed film made of aluminium and silicon is formed on a substrate by utilizing a sputtering method, if the conditions are optimized, then crystalline aluminium columns are formed within a matrix made of amorphous silicon. A diameter of the formed aluminium column is in a range of 0.5 to 15 nm. It is shown from the observation using a scanning electron microscope that aluminium is present in the form of a single column so as to extend from an interface of a substrate to a surface of a film. The formation of the same structure is verified as well with respect to a mixed film of aluminium and germanium formed by utilizing a sputtering method. A film thickness can be controlled by adjusting a sputtering time. Hence, even if the thickness is increased, the formation of the columnar structure is not interrupted unless the sputtering is discontinued.

Figure 3:
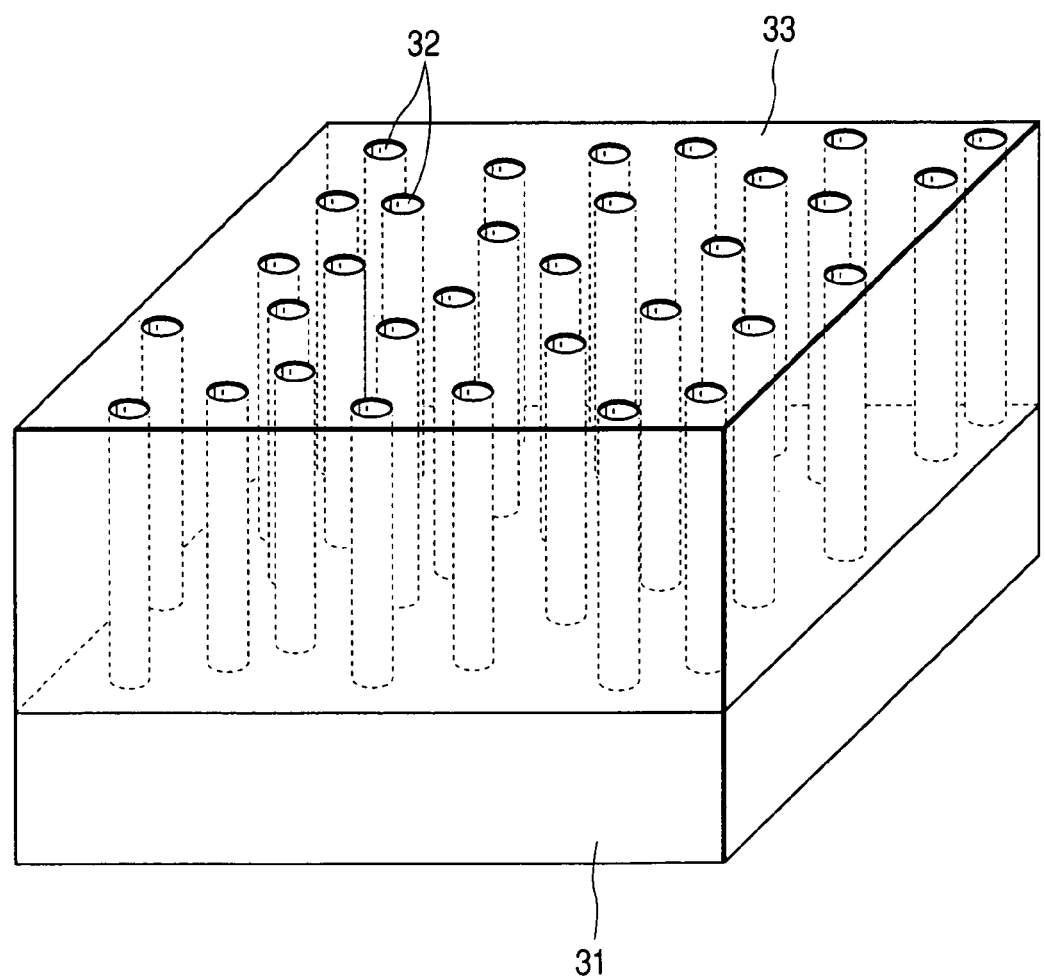
FIG. 3 is a schematic view showing a structure of a porous film according to the embodiment of the present invention.
Figure 4:
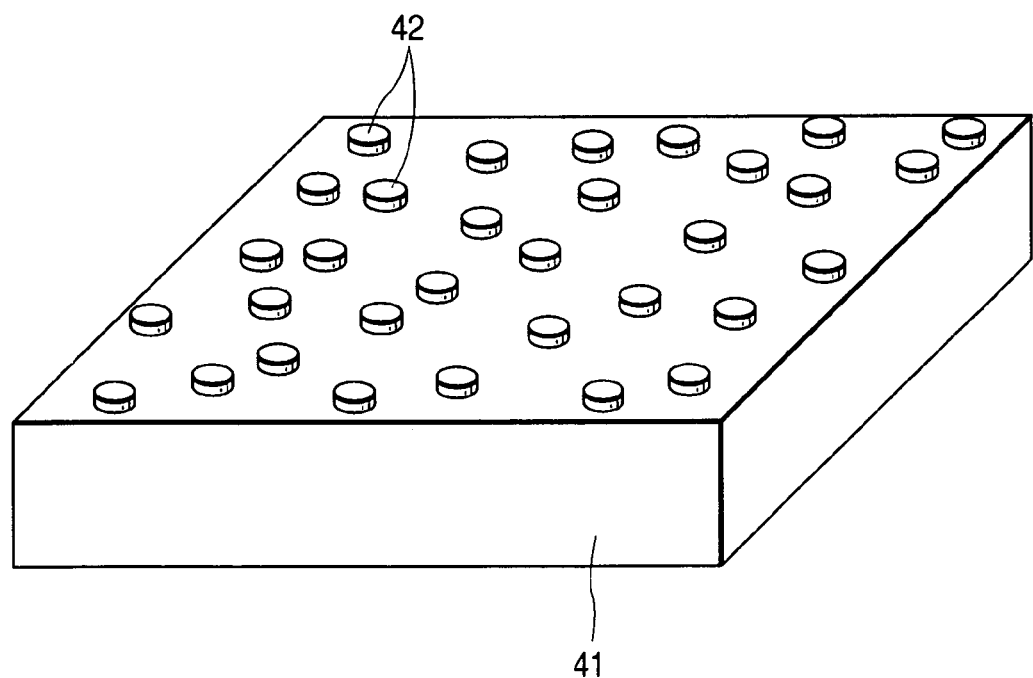
FIG. 4 is a schematic view showing arrangement of a dot pattern according to the embodiment of the present invention.

In this embodiment, a film which is obtained by removing the columnar substance from a film containing the columnar substance on a substrate 31 is used as a porous film 33 as shown in FIG. 3, a substance serving as a material of a mask is introduced into microholes 32 of the porous film 33, and the porous film is then removed to thereby obtain a dot pattern 42 as shown in FIG. 4 on a substrate. Then, the substrate is selectively etched with the dot pattern used as a mask to form a plurality of columnar portions of a columnar structured material each having an extremely minute structure simultaneously, i.e., in a short period of time.

Next, a description will hereinbelow be given with respect to a manufacturing method according to this embodiment.

Columnar portions of a columnar structured material each having an extremely minute diameter can be formed at extremely minute intervals on a substrate through the following processes (A) to (D). FIGS. 1 are schematic cross sectional views showing a method of manufacturing a columnar structured material according to this embodiment.

Process (A): Preparation of Substrate

Figure 1A:
FIGS. 1A, 1B, 1C, 1D, 1E, 1F and 1G are schematic cross sectional views showing an example of a method of forming a columnar structured material according to an embodiment of the present invention.

First of all, as shown in FIG. 1A, a substrate 11 is prepared. The substrate 11 is not basically intended to be limited in terms of material and thickness. Hence, various kinds of materials such as glass, a metal, ceramics, a semiconductor, and an organic substance can be used for the substrate 11. The substrate 11 may be formed of a bulk material in which the substrate itself becomes a columnar structured material, or a material layer (columnar structured material formation layer) serving as a columnar structured material may be formed on a surface of a base substrate. In this embodiment, a substrate as a bulk material, and a substrate structure having a columnar structured material formation layer formed on a surface of a base substrate are collectively referred to as a substrate.

While a semiconductor such as GaAs or InAs is a useful material for the substrate 11 from a viewpoint of application to optical devices and electronic devices, a material of the substrate 11 is not intended to be limited to such a semiconductor. A layer having a multiple quantum well structure including two or more layers such as AlGaAs/GaAs or GaAs/InGaAs may be formed as a columnar structured material formation layer on a surface of a base substrate in correspondence to a structure of a desired microstructured columnar structured material. In addition, this columnar structured material formation layer may be formed by utilizing an existing method such as a molecular beam epitaxial growth method (MBE method).

Process (B): Formation of Porous Film

Figure 1B:
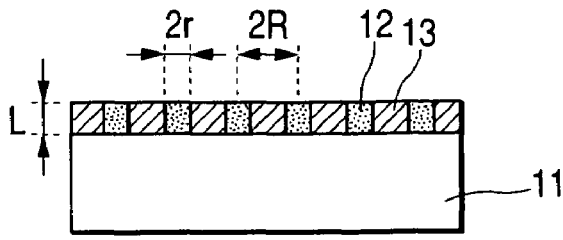
Figure 1C:

Next, a detailed description will hereinbelow given with respect to a method of forming a porous film 15 having microholes 14 as shown in FIG. 1C on the substrate 11.

As shown in FIG. 1B, a thin film having a structure in which columnar substances 12 as a first component of a columnar form are dispersed in a matrix 13 made of the other component is formed on the substrate 11 by utilizing a sputtering method using a target containing materials forming a eutectic system together in a suitable ratio. In this case, the used target does not need to be made of a mixed substance of two components. Hence, a material in which one substance is placed on the other substance may also be used as the target, or a material having a structure in which two substances are stuck on each other so as to give a desired area ratio may also be used.

Giving an exemplification, the sputtering is carried out in a state in which a suitable number of silicon wafers are placed on an alumninium target, whereby a film having the above-mentioned structure can be formed on the substrate 11.

The formation of a film is described by giving the sputtering method as an example. However, any film formation method can be applied to the present invention as long as the same structure is formed.

The average diameter $2r$ of the formed columnar substance 12 is in a range of 0.5 to 15 nm. In addition, the average center-to-center interval $2R$ of the columnar substance 12 is in a range of 5 to 20 nm (see FIG. 1B).

Next, as shown in FIG. 1C, the above-mentioned columnar substance 12 is selectively removed from the formed structure to form a porous film 15. The wet etching is preferably used for the selective removal of the columnar substance 12. For example, in the case of crystalline aluminium columns formed in a matrix made of amorphous silicon, only the crystalline aluminium columns can be etched away using phosphoric acid or sulfuric acid without changing the shape of silicon to thereby form microholes 14.

In addition, in order to simply carry out the subsequent processes, a process of subjecting the formed porous film 15 to a chemical processing to change the property of the porous layer may be carried out in some cases. More specifically, the chemical processing in this case means an oxidation processing or the like.

Process (C): Formation of Dot Pattern

Figure 1D:
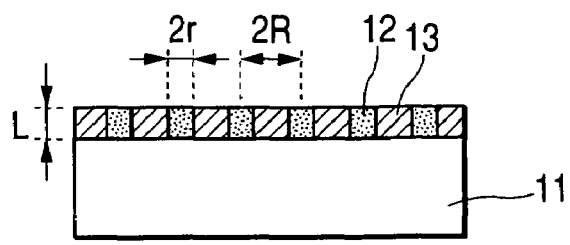

Next, a description will hereinbeolow be given with respect to a method of forming a dot pattern 16 within the microholes 14 of the porous film 15 as shown in FIG. 1D.

Any of metals such as Pt, Au, Ni, Al, or Ta, silicon oxide, silicon nitride or the like may be used as a material for the dot pattern. That is, any material may be used with which selectivity can be obtained with respect to the substrate 11 during the etching, and which is not an obstacle to the subsequent processes. In addition, if the substrate 11 has conductivity, then a metal or the like can be simply introduced through an electrodeposition process. Also, a substance serving as a catalyst may also be formed on bottoms of the microholes 14 through the electrodeposition process to form an objective material with assistance of the catalytic activity. Also, the catalyst to be formed on the bottoms of the microholes 14 may also be formed on the surface of the substrate 11 by utilizing the vapor deposition method or the like before the formation of the porous film 15.

In addition, an organic substance may also be used as a material for the dot pattern. An organic substance such as polyaniline is electrolytically polymerized within holes of the porous layer to thereby allow an excellent mask pattern to be obtained.

A pattern 16 of dots made of an objective dot pattern material, as shown in FIG. 1D, is formed through the above-mentioned process in the matrix 13 which surrounded the columns of the columnar substance 12 in the original film.

Figure 1E:
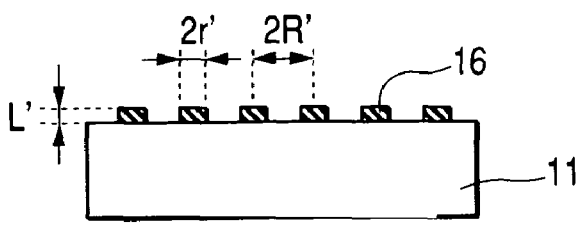

Next, as shown in FIG. 1E, the porous film 15 is removed. In this process, a structure is formed in which the porous film 15 is selectively removed so that only the dot pattern 16 is arranged on the substrate 11. FIG. 4 is a perspective view showing the dot pattern 16 (designated by reference numeral 42 in the figure) formed on the substrate 11 (designated by reference numeral 41 in the figure) through this process.

As for a method of selectively removing the porous film 15, a process such as an etching process can be applied. For example, in a case where silicon is a material for an original porous film and changed to silicon oxide after being subjected to the chemical processing in the process (B), the etching using dilute hydrofluoric acid can be satisfactorily applied.

The dot pattern 16 is formed on the substrate 11 as shown in FIG. 1E through the above-mentioned process C.

Process (D): Etching of Substrate

Figure 1F:
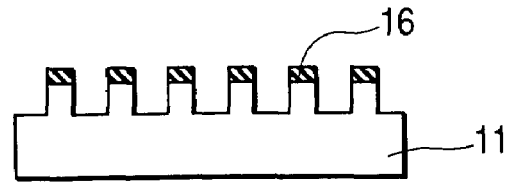

Next, as shown in FIG. 1F, the substrate 11 is selectively etched to form a columnar structured material 17 on the surface of the substrate 11. Here, while for this etching process, the wet etching using an acid may be used, the dry etching such as Ar ion milling etching or etching using reactive ions is more suitable. In particular, a reactive ion beam etching method (RIBE) as a method of applying ions accelerated at several hundreds to several kilo-volts to a specimen by an ion gun to etch the specimen is suitable since a vertical processing can be carried out with high accuracy.

Figure 1G:
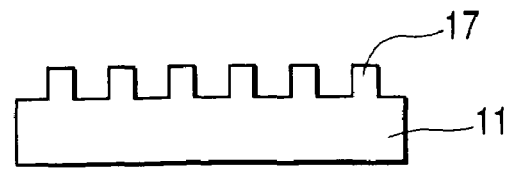

Next, as shown in FIG. 1G, if the dot pattern 16 which is used as an etching mask is removed using a plasma oxidation processing, a suitable acid treatment (wet), or the like, then the columnar structured material 17 made of a suitable material is obtained.

In addition, here, the formed columnar structured material 17 may be subjected to an annealing treatment to recrystallize the columnar structured material 17.

In addition, if atoms, molecules, a reactive gas or the like are applied to the holes of the columnar structured material 17 by utilizing an existing crystal growth technique such as an MBE method or a metal organic vapor phase epitaxial growth method (MOVPE), then a buried layer can be formed using any other material.

As described above, according to this embodiment, the novel porous film having the extremely minute structure is formed from the film made of a plurality of substances forming a eutectic system together, the substance serving as the mask material is introduced into the microholes of the porous film, and the porous film is then removed to thereby obtain the dot pattern. Then, the substrate is selectively etched with the dot pattern used as the etching mask to collectively form the columnar portions of the columnar structured material each having the extremely minute structure at the minute arrangement intervals.

Consequently, if the columnar structured material formed in accordance with this embodiment is applied to a semiconductor laser for example, then it is possible to realize the promotion of high performance such as reduction of a threshold current, stabilization of characteristics, and enhancement of a gain. Moreover, the columnar structured material can also be applied to an electronic device such as an operational element, and an optical device both utilizing the effect of enclosing the electrons or light and the quantum effect, to thereby contribute to promotion of an excellent function and high performance of such devices.

EXAMPLES

The present invention will hereinbelow be described in detail with respect to the following examples. However, the present invention is not intended to be limited to these embodiments, and hence materials, reactive conditions, and the like can be freely changed within a scope in which a columnar structured material having the same structure can be obtained Example 1

First Material Al, Second Material Si

In this example, there was obtained an aluminium microwire as a mixed film to be used as a host material of a porous film, in which an aluminium structured material portion surrounded by silicon had a columnar structure, a diameter $2r$ of 3 nm, an interval $2R$ of 7 nm, and a length L of 200 nm.

First, a description will be given of a production method for an aluminium microwire.

An aluminium/silicon mixture film containing 55 atomic % of silicon with respect to the total amount of aluminium and silicon was formed into a thickness of approximately 200 nm on a glass substrate by RF magnetron sputtering. Used as the target was a 4-inch aluminium target on which eight silicon chips 13 of 15 mm square were superposed. Sputtering conditions were set such that an RF power supply was used, an Ar flow rate of 50 sccm, a discharge pressure of 0.7 Pa, and a starting power of 1 kW. Also, the temperature of the substrate was set to the room temperature.

Note that the aluminium target on which the eight silicon chips were superposed was used here as the target. However, the number of the silicon chips is not limited thereto. The number changes depending on the sputtering conditions, and may be any number as long as the composition of the aluminium/silicon mixture film is approximately 55 atomic %. Also, the target is not limited to the aluminium target on which the silicon chips were superposed, and may be a silicon target on which aluminium chips are superposed, or a target obtained by sintering silicon and aluminium powders.

Next, the aluminium-silicon mixture film obtained in this way was analyzed concerning the fractional amount of silicon (atomic %) with respect to the total amount of aluminium and silicon through an ICP (induction-coupled plasma emission spectrometry). As a result, it was found that the fractional amount of silicon was about 55 atomic % with respect to the total amount of aluminium and silicon. Note that for the convenience of the measurement here, an aluminium-silicon mixture film deposited on a carbon substrate was used for a substrate.

The aluminium-silicon mixture film produced as described above was observed with an FE-SEM (field emission scanning electron microscope). As a shape of the surface viewed from directly above the substrate, circular aluminium nanostructured materials surrounded by silicon were arranged two-dimensionally. The hole diameter of the aluminium nanostructured material parts was 3 nm, and the average center-to-center interval thereof was 7 nm. In addition, when the cross section thereof was observed with the FE-SEM, the height of the film was 200 nm, and the respective aluminium nanostructured material parts were independent from each other.

Further, when this sample was observed by an X-ray diffraction method, a peak of silicon exhibiting crystallinity could not be confirmed and the silicon was amorphous.

Accordingly, the aluminium/silicon nanostructured material could be produced, which includes the aluminium microwire surrounded by silicon and having an interval 2R of 7 nm, a diameter 2r of 3 nm, and a length L of 200 nm.

COMPARATIVE EXAMPLE

As a comparative sample A of the example above, the aluminium/silicon mixture film containing 15 atomic % of silicon with respect to the total amount of aluminium and silicon was formed on the glass substrate into a thickness of approximately 200 nm by sputtering. Used as the target was the 4-inch aluminium target on which two silicon chips 13 of 15 mm square were superposed. The sputtering conditions were set such that the RF power supply was used, an Ar flow rate of 50 sccm, a discharge pressure of 0.7 Pa, and a starting power of 1 kW. Also, the temperature of the substrate was set to the room temperature.

The comparative sample A was observed by FE-SEM (field emission scanning electron microscope). With regard to the form of the surface viewed from right above the substrate, an aluminium portion did not have a circular form, but had a rope form. That is, the microstructured material in which columns of the columnar structured material of aluminium were uniformly dispersed within a silicon region could not be obtained. Further, the size was far larger than 10 nm. Also, when the section was observed by FE-SEM, the width of the aluminium portion exceeded 15 nm. Note that the aluminium/silicon mixture film thus obtained was subjected to analysis of the fractional amount (atomic %) of silicon with respect to the total amount of aluminium and silicon by ICP (induction-coupled plasma emission spectrometry). As a result, the fractional amount of silicon with respect to the total amount of aluminium and silicon was 15 atomic %.

Further, as a comparative sample B, the aluminium/silicon mixture film containing 75 atomic % of silicon with respect to the total amount of aluminium and silicon was formed on the glass substrate into a thickness of approximately 200 nm by sputtering. Used as the target was the 4-inch aluminium target on which fourteen silicon chips 13 of 15 mm square were superposed. The sputtering conditions were set such that the RF power supply was used, an Ar flow rate of 50 sccm, a discharge pressure of 0.7 Pa, and a starting power of 1 kW. Also, the temperature of the substrate was set to the room temperature.

The comparative sample B was observed by FE-SEM (field emission scanning electron microscope). In the sample surface viewed from right above the substrate, the aluminium portion could not be observed. Also, even when the section was observed by FE-SEM, the aluminium portion could not be observed clearly. Note that the aluminium/silicon mixture film thus obtained was subjected to analysis of the fractional amount (atomic %) of silicon with respect to the total amount of aluminium and silicon by ICP (induction-coupled plasma emission spectrometry). As a result, the fractional amount of silicon with respect to the total amount of aluminium and silicon was 75 atomic %.

Further, samples were each prepared only by changing the condition of the number of the silicon chips compared to the case of producing the comparative sample A such that the proportions of silicon with respect to the total amount of the aluminium/silicon mixture were respectively 20 atomic %, 35 atomic %, 50 atomic %, 60 atomic %, and 70 atomic %. The following table shows the case where the microstructured material in which columns of the columnar structured material of aluminium were uniformly dispersed within a silicon region was obtained, which is represented by "Yes", and the case where the microstructured material was not obtained, which is represented by "No".

TABLE 1

| Proportion of Silicon (atomic %) | Microstructured Material |
| --- | --- |
| 15 (Comparative Example A) | No |
| 20 | Yes |
| 25 | Yes |
| 35 | Yes |
| 50 | Yes |
| 55 | Yes |
| 60 | Yes |
| 65 | Yes |
| 70 | Yes |
| 75 (Comparative Example B) | No |

Accordingly, the content of silicon with respect to the total amount of aluminium and silicon was adjusted to a range from 20 atomic % to 70 atomic %, thereby making it possible to control the hole diameter of the produced aluminium nanostructured material and to produce the aluminium microwire superior in linearity. Note that for observation of the structure, TEM (transmission electron microscope) or the like may be utilized in addition to SEM. Note that the above-mentioned content was the same even when using germanium or the mixture of silicon and germanium instead of silicon described above.

Further, as a comparative sample C, the aluminium/silicon mixture film containing 55 atomic % of silicon with respect to the total amount of aluminium and silicon was formed on the glass substrate into a thickness of approximately 200 nm by sputtering. Used as the target was the 4-inch aluminium target on which eight silicon chips 13 of 15 mm square were superposed. The sputtering conditions were set such that the RF power supply was used, an Ar flow rate of 50 sccm, a discharge pressure of 0.7 Pa, and a starting power of 1 kW. Also, the temperature of the substrate was set to 250° C.

The comparative sample C was observed by FE-SEM (field emission scanning electron microscope). In the sample surface viewed from right above the substrate, the boundary between aluminium and silicon could not be observed clearly. That is, the aluminium nanostructured material could not be observed. In other words, under the substrate temperature being too high, the state became more stable, so that it was assumed that the film growth for forming the aluminium nanostructured material cannot be attained.

Note that in order to obtain the structured material in which the columnar members are dispersed, it is also a preferable form that the composition of the target is set as Al:Si=55:45 or the like.

Example 2

This Example is an example in which a porous film made of silicon oxide was formed using aluminium and silicon as substances forming eutectic together, a pattern of dots made of gold was formed using the porous film, and a substrate made of GaAs that is a typical semiconductor material was etched to form a GaAs columnar structured material having a very minute structure.

In this example, a GaAs substrate was used as a substrate. A description will hereinbelow be given with respect to a method of forming a porous film made of silicon on this substrate.

First, a mixed film made of aluminium and silicon having a film thickness of 100 nm was formed on the substrate. Used as the target was a 4-inch aluminium target on which six silicon chips of 15 mm square were superposed. Sputtering was carried out using RF power supply under the conditions of: Ar flow rate of 50 sccm; a discharge pressure of 0.7 Pa; and a starting power of 300 W. Also, a temperature of the substrate was set to the room temperature.

Here, as the target, one having six silicon chips arranged on an aluminium target was used. However, the number of the silicon chips is not limited thereto because it varies according to the sputtering conditions, and it may be such that a desired structure can be formed having aluminium columns dispersed in silicon, as described below. In addition, the target is not limited to one having silicon chips arranged on an aluminium target, and it may be one having aluminium chips arranged on a silicon target, or a target obtained by sintering silicon and aluminium powders may be used.

Further, the RF sputtering was used as a sputtering method in this example, but it is not limited thereto; it may be an ECR sputtering method, a DC sputtering method, or an ion beam sputtering method. Further, the sputtering conditions depend on an apparatus and are not limited to the conditions described above. In addition, even among vapor deposition methods other than the sputtering method, any methods with which a desired structure can be formed may be applied to the present invention.

The aluminium-silicon mixture film obtained in this way was analyzed concerning the fractional amount of silicon (atomic %) with respect to a total amount of aluminium and silicon through ICP (induction-coupled plasma emission spectrometry). As a result, it was found that the fractional amount of silicon was about 37 atomic % with respect to the total amount of aluminium and silicon.

Further, the aluminium-silicon mixture film produced as described above was observed with the field emission scanning electron microscope (FE-SEM). It was observed that substantially circular minute aluminium columns surrounded by silicon material were arranged two-dimensionally. The average hole diameter $2r$ of the aluminium column parts, which was found through image processing, was 5 nm, and the average center-to-center interval $2R$ thereof was 10 nm. In addition, when the cross section thereof was observed with the FE-SEM, a height L of the film was 100 nm, and the respective aluminium column parts were independent of each other.

In addition, when this thin film sample was analyzed through the X-ray diffraction method, a diffraction line of silicon was not confirmed, and it was understood that the silicon was amorphous. On the other hand, a plurality of diffraction lines of aluminium were confirmed, and it was therefore understood that aluminium was polycrystalline.

Based on the above, production of the aluminium-silicon structured material was confirmed which contains crystalline aluminium columns whose vicinities were surrounded by amorphous silicon and which have an average diameter 5 nm and an average height of 100 nm.

Next, this aluminium-silicon structured material obtained as described above was immersed in 98% sulfuric acid, and etching was selectively performed for the aluminium columnar structure parts to form microholes. As a result of the observation with the FE-SEM for the film after the etching, it was confirmed that only the aluminium columns were removed, and the film became porous. It was understood that the shape of the silicon part was not substantially changed as compared with its state before the aluminium removal. In this case as well, when the cross section thereof was observed with the FE-SEM, it became apparent that aluminium was completely removed up to the substrate interface. By following the above steps, the porous silicon film having on the substrate the through holes perpendicular to the substrate could be produced.

Next, a description will now be given with respect to a method of introducing gold into the formed porous film to form a dot pattern.

First of all, the silicon porous film formed through the above-mentioned processes was dipped in a commercial electroplating liquid (an electroplating liquid for gold manufactured by KOJUNDO CHEMICAL LABORATORY. CO. LTD., a trade code K-24E), and the electrodeposition was carried out in an acid bath (pH=4.5) having a temperature held at 40° C. at a current density of 0.5 A/dm$^2$.

The film after being subjected to the gold electrodeposition was rinsed with pure water, and thereafter the surface and the cross section thereof were observed with the FE-SEM. As a result, it was confirmed that gold was introduced into the microholes uniformly, and a minute columnar structure was formed.

This film was dipped in a 30% aqueous solution of sodium hydroxide to remove silicon present in the periphery of gold. This processing using the aqueous solution of sodium hydroxide offers the effect as well of removing an oxide layer present on the surface of the GaAs substrate to clean the surface of the GaAs substrate. The substrate after completion of the removal of silicon was observed with an FE-SEM, and as a result, it was confirmed that the minute columnar portions of the columnar structured material made of gold were arranged with high density on the surface of the substrate to form the pattern of dots made of gold. An average diameter $2r'$, an average center-to-center interval $2R'$ and a height $L'$ of the gold columnar structured material which were obtained through the image processing were 5 nm, 10 nm, and 10 nm, respectively.

Next, the substrate having the dot pattern formed thereon was selectively etched. The etching was carried out by utilizing a reactive ion beam etching method (RIBE). But, if the RIBE method was used, then the surface of the GaAs substrate may be damaged due to the accelerated ions struck against the surface of the GaAs substrate in some cases. In such cases, as will be described later, it is preferable to subject the substrate to an annealing treatment.

After completion of the above-mentioned etching process, the substrate was dipped in an aqueous solution of ($Na_2SO_4$, $C_6FeK_3N_6$, and $H_2NCSNH_2$) to remove the pattern of dots made of gold.

Moreover, the substrate was installed in the ambient atmosphere rich in As, and the temperature of the substrate was then raised up to 580° C. to anneal the substrate to thereby carry out recrystallization.

When the substrate obtained through the above-mentioned process was observed with a transmission electron microscope (TEM), it was observed that microstructured columnar portions made of GaAs were arranged on the substrate, and hence it was confirmed that a columnar structured material was formed. A diameter and a height of the columnar structured material roughly estimated from the observed TEM image were 4 nm, and 20 nm, respectively, and a center-to-center interval of the columnar structured material was 10 nm.

Consequently, according to this example, it was confirmed that the dot pattern was formed from the above-mentioned porous film to be used as the mask, whereby a plurality of columnar portions of the columnar structured material made of GaAs having the extremely minute structure could be simultaneously formed at the minute intervals.

Example 3

In this example, a porous film made of germanium was formed using aluminium and germanium as substances forming eutectic together, a pattern of dots made of gold was formed using the porous film, and a substrate having a multiple quantum well structure made of GaAs/InGaAs formed thereon was selectively etched to form a columnar structured material made of GaAs/InGaAs. When an application to an optical device, an electronic device or the like is considered, a minute columnar structured material made of a plurality of semiconductor layers is very useful.

Figure 5A:
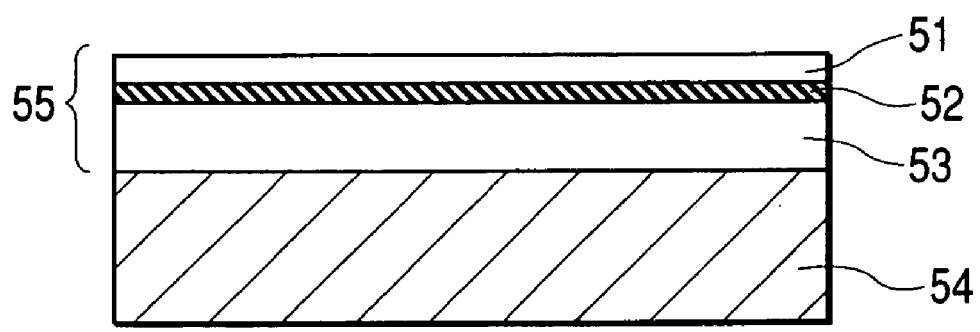
FIGS. 5A and 5B are schematic cross sectional views showing a substrate and a columnar structured material according to Example 3 of the present invention.

In this example, as shown in FIG. 5A, a columnar structured material formation layer 55 made of GaAs/InGaAs (a first GaAs layer 51, an InGaAs layer 52, and a second GaAs layer 53) was formed on a base substrate 54 to be used as a substrate. A description will hereinbelow be given with respect to a method of forming a porous film made of germanium on this substrate.

First, a mixed film made of aluminium and germanium having a film thickness of 200 nm was formed. Used as the target was a 4-inch aluminium target on which four germanium chips of 15 mm square were superposed. Sputtering was carried out using RF power supply under the conditions of: Ar flow rate of 50 sccm; a discharge pressure of 0.7 Pa; and a starting power of 1 kW. Also, a temperature of the substrate was set to the room temperature.

Here, as the target, one having four germanium chips arranged on an aluminium target was used. However, the number of the germanium chips is not limited thereto because it varies according to the sputtering conditions, and it may be such that a desired structure can be formed having aluminium columns dispersed in germanium, as described below. In addition, the target is not limited to one having germanium chips arranged on an aluminium target, and it may be one having aluminium chips arranged on a germanium target, or a target obtained by sintering germanium and aluminium powders may be used.

Further, the RF sputtering was used as a sputtering method here, but it is not limited thereto; it may be an ECR sputtering method, a DC sputtering method, or an ion beam sputtering method. Further, the sputtering conditions depend on an apparatus and are not limited to the conditions described above. In addition, even among vapor deposition methods other than the sputtering method, any methods with which a desired structure can be formed may be applied to the present invention.

Next, the aluminium-germanium mixture film obtained in this way was analyzed concerning the fractional amount of germanium (atomic %) with respect to the total amount of aluminium and germanium through ICP (induction-coupled plasma emission spectrometry). As a result, it was found that the fractional amount of germanium was about 37 atomic % with respect to the total amount of aluminium and germanium.

The aluminium-germanium mixture film produced as described above was observed with the field emission scanning electron microscope (FE-SEM). It was observed that substantially circular minute aluminium columns surrounded by germanium material were arranged two-dimensionally. The average hole diameter $2r$ of the aluminium column parts, which was found through image processing was 10 nm, and the average center-to-center interval $2R$ thereof was 15 nm. In addition, when the cross section thereof was observed with the FE-SEM, the height L of the film was 100 nm, and the respective aluminium column parts were independent of each other.

In addition, when this thin film sample was analyzed through the X-ray diffraction method, a diffraction line of germanium was not confirmed, and it was understood that germanium was amorphous. On the other hand, a plurality of diffraction lines of aluminium were confirmed, and it was therefore understood that aluminium was polycrystalline.

Based on the above, production of the aluminium-germanium structured material was confirmed which contains crystalline aluminium columns whose vicinities were surrounded by amorphous germanium and which have the diameter $2r$ of 10 nm, the interval $2R$ of 15 nm, and the height L of 100 nm.

This aluminium-germanium structured material was immersed in 98% sulfuric acid (dense sulfuric acid), and etching was selectively performed for the aluminium columnar structure parts to form microholes.

As a result of the observation with the FE-SEM for the film after the etching, it was confirmed that only the aluminium columns were removed, and the film became porous. It was understood that the shape of the germanium part was not substantially changed as compared with its state before the aluminium removal. In this case as well, when the cross section thereof was observed with the FE-SEM, it became apparent that aluminium was completely removed up to the substrate interface. By following the above steps, the porous germanium film having on the substrate the through holes perpendicular to the substrate could be produced.

Next, a description will now be given with respect to a method of introducing gold into the formed porous film to form a dot pattern.

First of all, the germanium porous film formed through the above-mentioned processes was dipped in a commercial electroplating liquid (an electroplating liquid for gold manufactured by KOJUNDO CHEMICAL LABORATORY. CO. LTD., a trade code K-24E), and the electrodeposition was carried out in an acid bath (pH=4.5) having a temperature held at 40° C. at a current density of 0.5 A/dm$^2$.

The film after being subjected to the gold electrodeposition was rinsed with pure water, and thereafter the surface and the cross section thereof were observed with the FE-SEM. As a result, it was confirmed that gold was introduced into the microholes uniformly, and a columnar structure was formed.

This film was dipped in a 50% aqueous solution of nitric acid to remove germanium present in the periphery of gold. The substrate after completion of the removal of germanium was observed with an FE-SEM, and as a result, it was confirmed that the minute columnar portions of the columnar structured material made of gold were arranged with high density on the surface of the substrate to form the pattern of dots made of gold. The average diameter $2r'$ and the average center-to-center interval $2R$ of the gold columnar structured material obtained on the basis of the image processing were 10 nm and 15 nm, respectively.

Next, the substrate having the dot pattern formed thereon was selectively etched. The etching was carried out by utilizing a reactive ion beam etching method (RIBE). But, if the RIBE method is used, then the surface of the GaAs substrate may be damaged due to the accelerated ions struck against the surface of the GaAs substrate in some cases. In such cases, as will be described later, it is preferable to subject the substrate to an annealing treatment.

After completion of the above-mentioned etching process, the substrate was dipped in an aqueous solution of ($Na_2SO_4$, $C_6FeK_3N_6$, and $H_2NCSNH_2$) to remove the pattern of dots made of gold.

Moreover, the substrate was installed in the ambient atmosphere rich in As, and the temperature of the substrate was then raised up to 580° C. to anneal the substrate to thereby carry out recrystallization.

Figure 5B:
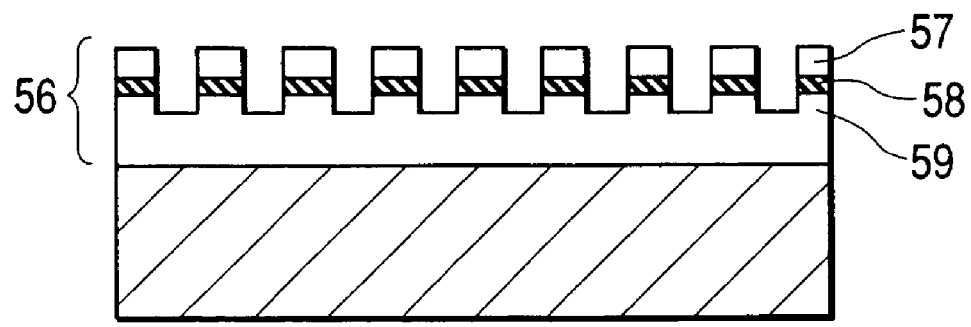

When the substrate obtained through the above-mentioned processes was observed with a transmission electron microscope (TEM), it was observed that columnar portions of a columnar structured material 56 (including a first GaAs layer 57, an InGaAs layer 58, and a second GaAs layer 59) made of GaAs/InGaAs as shown in FIG. 5B were arranged on the surface of the substrate 54, and it was also confirmed that the minute columnar structured material 56 was formed. The diameter and height of each dot roughly estimated from the observed image were 8 nm and 60 nm, respectively, and the dots were arranged at center-to-center intervals of 15 nm.

Consequently, according to this example, it was confirmed that the dot pattern was formed from the above-mentioned porous film to be used as the mask, whereby a plurality of columnar portions of the columnar structured material made of GaAs/InGaAs having the extremely minute structure could be simultaneously formed at the minute intervals.

As set forth hereinabove, according to the present invention, the pattern of the minute dots is formed using the novel porous film in which the microhole diameter of each microhole is extremely minute, and the microholes are arranged at extremely minute intervals, and the columnar structured material having the extremely minute structure can be formed so as to be densely arranged with the dot pattern used as the etching mask. In addition, if the columnar structured material according to the present invention is applied to a semiconductor laser for example, then it is possible to realize the promotion of high performance such as reduction of a threshold current, stabilization of characteristics, and enhancement of a gain. Moreover, it is to be understood that the present invention can also be applied to manufacturing of electronic devices such as an operational element, and an optical device both utilizing the effect of closing the electrons or light and the quantum effect.

The invention claimed is:

1. A method of manufacturing a dot pattern, comprising the steps of:
   preparing a structured material composed of a plurality of columnar members containing a first component and a region containing a second component different from the first component surrounding the columnar members, the structured material being formed by depositing the first component and the second component on a substrate;
   removing the columnar members from the structured material to form a porous material having a columnar hole;
   introducing a mask material into the columnar hole of the porous material to form a dot pattern; and
   removing the porous material.

2. The method of manufacturing a dot pattern according to claim 1, wherein the second component is contained at a ratio of not less than 20 atomic % and not more than 70 atomic % with respect to the total amount of the first component and the second component.

3. A method of manufacturing a columnar structured material using a dot pattern manufactured by the method according to claim 1, and further comprising:
   a step of etching the substrate with the dot pattern as a mask; and
   a step of removing the dot pattern.

4. The method of manufacturing a columnar structured material according to claim 3, wherein the step of etching the substrate with the dot pattern as a mask is a dry etching step.

5. The method of manufacturing a dot pattern according to claim 1, wherein the removing step of removing the columnar members is an etching step.

6. The method of manufacturing a dot pattern according to claim 1, wherein the introducing step of introducing the material into the holes is an electrodeposition step.

7. The method of manufacturing a dot pattern according to claim 1, wherein the material contains a noble metal.

8. The method of manufacturing a dot pattern according to claim 1, wherein the first component and the second component form a eutectic system.

9. The method of manufacturing a dot pattern according to claim 1, wherein the second component is contained at a ratio of not less than 30 atomic % and not more than 60 atomic % with respect to the total amount of the first component and the second component.

10. The method of manufacturing a dot pattern according to claim 1, wherein the plurality of columnar members are crystalline aluminum columns.

11. The method of manufacturing a dot pattern according to claim 1, wherein the region is composed of an amorphous $Si_xGe_{1-x}(0<x<1)$.

12. The method of manufacturing a dot pattern according to claim 1, wherein the deposition of the first component and the second component is performed by a sputtering method.

13. A method of manufacturing a dot pattern, comprising the steps of:
   preparing a structured material composed of a plurality of columnar members containing a first component and a region containing a second component different from the first component surrounding the columnar members, the structured material being formed by sputtering the first component and the second component on a substrate;
   removing the columnar members from the structured material to form a porous material having a columnar hole;
   introducing a material into the columnar hole portions of the porous material to form a dot pattern ;and
   removing the porous material.

* * * * *

UNITED STATES PATENT AND TRADEMARK OFFICE
CERTIFICATE OF CORRECTION

PATENT NO. : 7,387,967 B2
APPLICATION NO. : 10/535452
DATED : June 17, 2008
INVENTOR(S) : Miki Ogawa et al.

Page 1 of 1

It is certified that error appears in the above-identified patent and that said Letters Patent is hereby corrected as shown below:

<u>COLUMN 1</u>:

Line 55, "trough" should read --through--.

<u>COLUMN 2</u>:

Line 49, "piller-like" should read --pillar-like--.

<u>COLUMN 8</u>:

Line 32, "alumninium" should read --aluminium--.
    Line 60, "hereinbeolow" should read --hereinbelow--.

Signed and Sealed this

Seventeenth Day of February, 2009

JOHN DOLL
*Acting Director of the United States Patent and Trademark Office*